United States Patent
Fu et al.

(10) Patent No.: US 9,536,751 B2
(45) Date of Patent: Jan. 3, 2017

(54) METHOD FOR FORMING PATTERNS FOR SEMICONDUCTOR DEVICE

(71) Applicant: UNITED MICROELECTRONICS CORP., Hsin-Chu (TW)

(72) Inventors: Tzu-Hao Fu, Kaohsiung (TW); Home-Been Cheng, Keelung (TW); Ci-Dong Chu, Miaoli County (TW); Tsung-Yin Hsieh, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/741,426

(22) Filed: Jun. 16, 2015

(65) Prior Publication Data

US 2016/0351410 A1 Dec. 1, 2016

(30) Foreign Application Priority Data

May 28, 2015 (CN) .......................... 2015 1 0282156

(51) Int. Cl.
*H01L 21/308* (2006.01)
*H01L 21/768* (2006.01)

(52) U.S. Cl.
CPC ....... *H01L 21/3088* (2013.01); *H01L 21/3081* (2013.01); *H01L 21/3085* (2013.01); *H01L 21/3086* (2013.01); *H01L 21/76816* (2013.01); *H01L 21/76877* (2013.01)

(58) Field of Classification Search
None
See application file for complete search history.

(56) References Cited

U.S. PATENT DOCUMENTS

| | | | | |
|---|---|---|---|---|
| 8,782,586 B2 * | 7/2014 | Sezginer | ............. | G06F 17/5077 716/126 |
| 2012/0244711 A1 * | 9/2012 | Yin | ..................... | H01L 21/0337 438/703 |
| 2014/0097520 A1 * | 4/2014 | Millward | .......... | H01L 21/76816 257/622 |
| 2014/0199832 A1 * | 7/2014 | Nguyen | ............ | H01L 21/02244 438/637 |
| 2014/0315380 A1 * | 10/2014 | Kanakasabapathy | | H01L 21/76802 438/618 |

* cited by examiner

*Primary Examiner* — Evren Seven
*Assistant Examiner* — Steven Christopher
(74) *Attorney, Agent, or Firm* — Winston Hsu; Scott Margo

(57) ABSTRACT

A method for forming patterns for semiconductor device includes following steps. A substrate is provided. The substrate includes a hard mask layer and a sacrificial layer formed thereon. A plurality of spacer patterns parallel with each other are formed on the substrate. A plurality of first blocking layers are formed in the sacrificial layer after forming the spacer patterns. A plurality of second blocking layers exposing at least a portion of the sacrificial layer and at least a portion the first blocking layer are formed on the substrate after forming the first blocking layer. Next, the sacrificial layer and the hard mask layer are etched with the spacer patterns, the first blocking layers and the second blocking layer being used as etching masks to form a patterned hard mask layer on the substrate.

13 Claims, 12 Drawing Sheets

100

US 9,536,751 B2

METHOD FOR FORMING PATTERNS FOR SEMICONDUCTOR DEVICE

BACKGROUND OF THE INVENTION

1. Field of the Invention

The present invention relates to a method for forming patterns for semiconductor device, and more particularly, to a method for forming semiconductor device involved with multiple patterning technique.

2. Description of the Prior Art

Photolithography is one of the basic processes used for manufacturing semiconductor devices which construct integrated circuits (ICs) in semiconductor factory. When fabricating those semiconductor devices, wafer/substrate or layers formed on substrate is/are patterned to create geometric features for realizing the elements that are to form the devices. As semiconductor manufacturing processes continue to advance, the dimensions of circuit elements have continually been reduced while the amount of functional elements, such as transistors, has been steadily increasing over decades. That is, the feature size becomes smaller while the pattern including those features becomes more and more complicated. As feature sizes continue to decrease, the existing lithography processes meet their bottleneck to successfully render the features.

However, the ultimate goal in integrated circuit fabrication is to faithfully reproduce the original circuit design. There is therefore a continuing need in the semiconductor processing art to develop a method for precisely forming the wanted/desirable features on wafers.

SUMMARY OF THE INVENTION

According to an aspect of the present invention, a method for forming patterns for semiconductor device is provided. The method includes following steps: A substrate is provided. The substrate includes a hard mask layer and a sacrificial layer formed thereon. A plurality of spacer patterns parallel with each other are formed on the substrate. A plurality of first blocking layers are formed in the sacrificial layer after forming the spacer patterns. A plurality of second blocking layers exposing at least a portion of the sacrificial layer and at least a portion the first blocking layer are formed on the substrate after forming the first blocking layers. Next, the sacrificial layer and the hard mask layer are etched with the spacer patterns, the first blocking layers and the second blocking layer being used as etching masks to form a patterned hard mask layer on the substrate.

According to the method for forming patterns for semiconductor device provided by the present invention, the desirable/object patterns are decomposed into the spacer patterns, the first blocking layers and the second blocking layers. With the spacer patterns, the first blocking layers, and the second blocking layers serving as masks, the hard mask layer is patterned and thus the patterned hard mask layer is obtained. Therefore, the patterned hard mask layer includes the desirable/object patterns transferred from the spacer patterns, the first blocking layers and the second blocking layers. Accordingly, the method for forming the patterns for semiconductor device provide by the present invention is able to precisely and accurately form the required fine features and thus process yield is ensured.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7B, which are schematic drawings illustrating a method for forming patterns for semiconductor device provided by a first preferred embodiment of the present invention, wherein FIGS. 3B-7B are cross-sectional views taken along a line B-B' of FIGS. 3A-7A, respectively.

FIGS. 8A-12B, which are schematic drawings illustrating a method for forming patterns for semiconductor device provided by a second preferred embodiment of the present invention, wherein FIGS. 8B-12B are cross-sectional views taken along a line C-C' of FIGS. 8A-12A, respectively.

DETAILED DESCRIPTION

Figure 1:
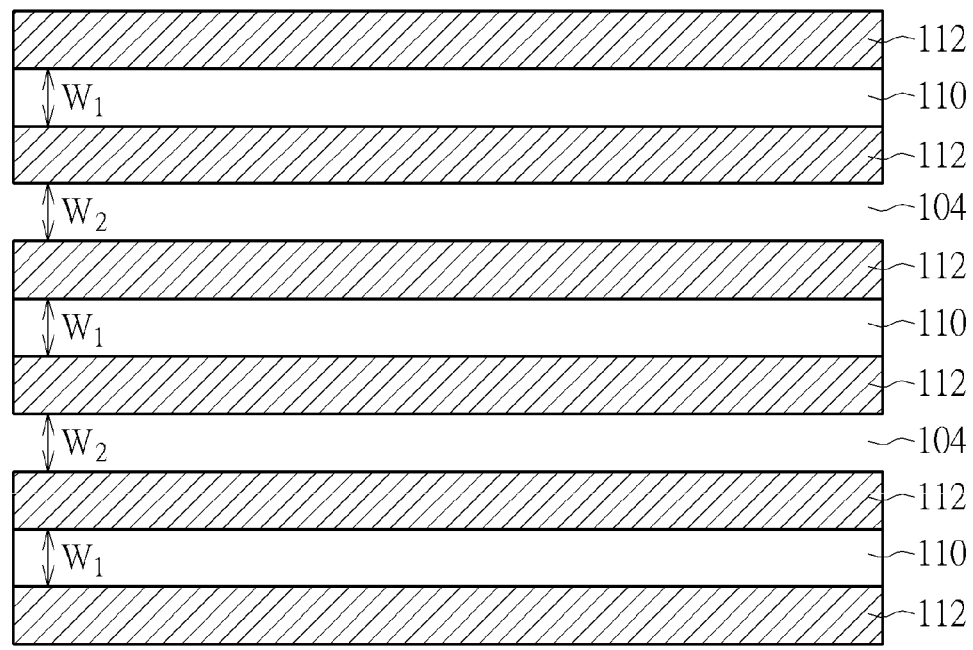
Figure 1:
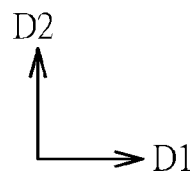

Please refer to FIGS. 1-7B, which are schematic drawings illustrating a method for forming patterns for semiconductor device provided by a first preferred embodiment of the present invention. FIG. 2B is a cross-sectional view taken along a line A-A' of FIG. 2A, and FIGS. 3B-7B respectively are cross-sectional views taken along a line B-B' of FIGS. 3A-7A. As shown in FIG. 1, the preferred embodiment first provides a substrate 100, such as a silicon substrate. The substrate 100 can include a silicon-on-insulator (hereinafter abbreviated as SOI) substrate or a bulk silicon substrate if required. Furthermore, the substrate 100 can even include dielectric layer if required, but not limited to this. It is therefore concluded that the substrate 100 provided by the preferred embodiment can be any suitable substrate or lamination capable of accommodating semiconductor IC elements. The substrate 100 includes at least a hard mask layer 102 (shown in FIG. 2B) and a sacrificial layer 104 formed thereon. In the preferred embodiment, the hard mask layer 102 can include a metal hard mask layer. For example but not limited to, the hard mask layer 102 can include titanium nitride (hereinafter abbreviated as TiN). The sacrificial layer 104 includes material having an etching rate different from the hard mask layer 102. For example but not limited to, the sacrificial layer 104 can include negative photoresist. Next, a plurality of mandrel patterns 110 are formed on the substrate 100. The mandrel patterns 110 can include polysilicon, but not limited to this. As shown in FIG. 1, the mandrel patterns 110 are all extended along a first direction D1, therefore the mandrel patterns 110 are parallel with each other. More important, the mandrel patterns 110 are arranged along a second direction D2. And the first direction D1 is perpendicular to the second direction D2 in the preferred embodiment, but not limited to this. After forming the mandrel patterns 110, a layer having an etching rate different from the mandrel patterns 110 is formed on the substrate 100. In the preferred embodiment, the mandrel patterns 100 include polysilicon, therefore the layer preferably includes an insulating layer. The insulating layer is then etched back and thus a spacer 112 is respectively formed on sidewalls of each mandrel pattern 110. As shown in FIG. 1, after forming the spacers 112, the sacrificial layer 104 is exposed on the substrate 100. Furthermore, a spacing width $W_1$ between the spacers 112 formed on respective two sides of one mandrel pattern 110 (that is also a width of the mandrel patterns 110) is the same with a spacing width $W_2$ between the spacers 112 formed on two adjacent mandrel patterns 110. However, the spacing width $W_1$ and the spacing width $W_2$ can be adjusted independently.

Figure 2A:
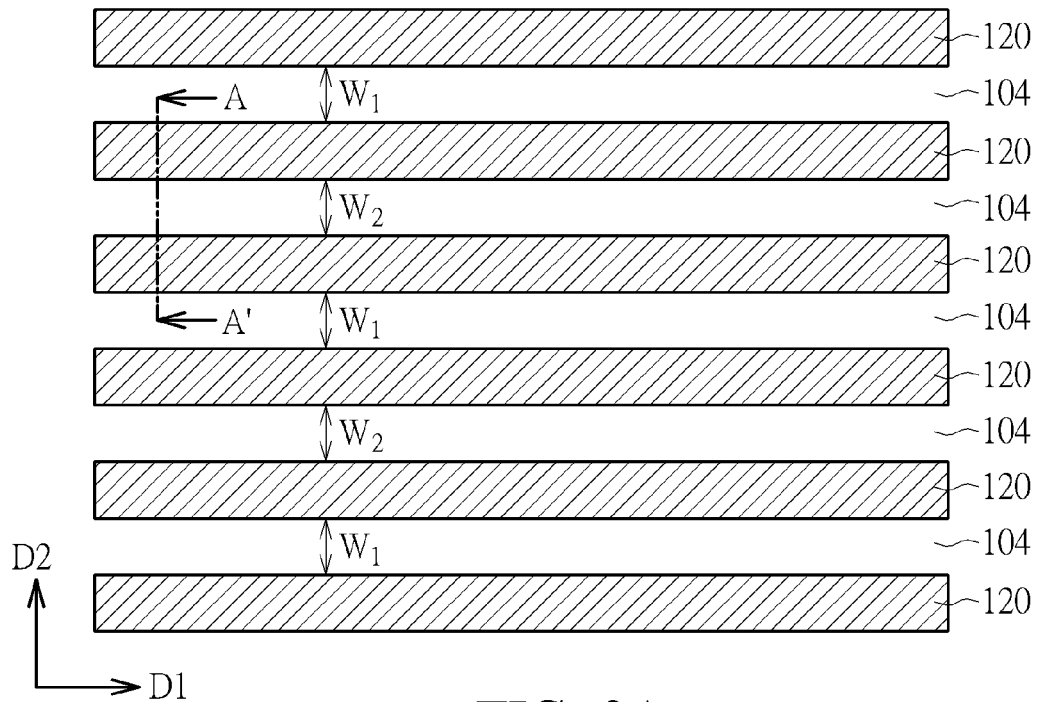
Figure 2B:
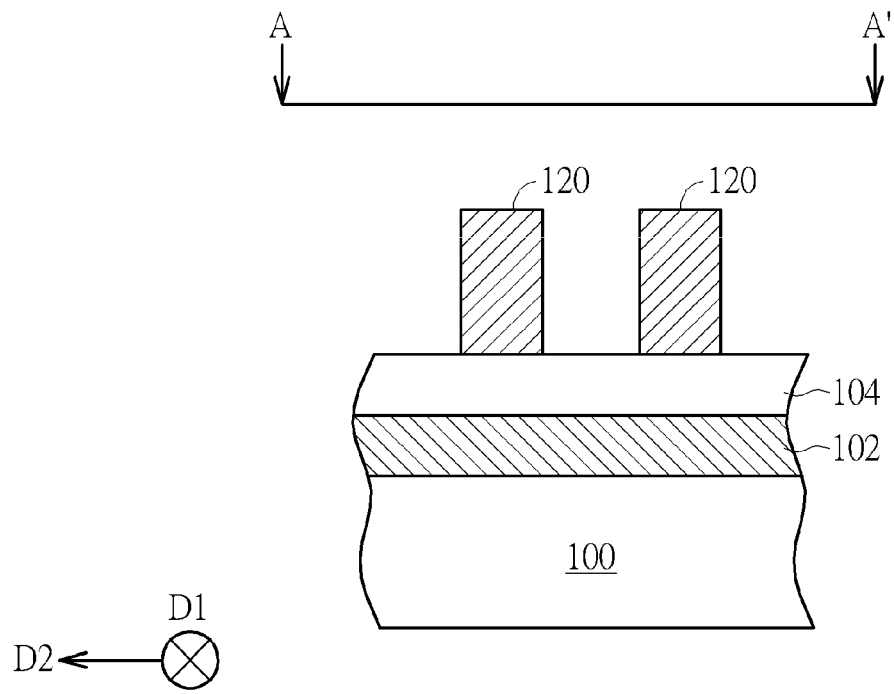
FIG. 2B is a cross-sectional view taken along a line A-A' of FIG. 2A.

Please refer to FIGS. 2A and 2B. After forming the spacers 112, the mandrel patterns 110 are removed and thus a plurality of spacer patterns 120 are formed on the substrate 100. Since the spacers 112 includes materials whose etching rate is different from the mandrel patterns 110, the mandrel patterns 110 are removed without consuming or damaging the spacers 112 according to the preferred embodiment. As shown in FIGS. 2A and 2B, the spacer patterns 120 are extended along the first direction D1 and parallel with each other. Furthermore, the spacer patterns 120 are arranged along the second direction D2. After removing the mandrel patterns 110, the sacrificial layer 104 is exposed between the spacer patterns 120. And spacing widths $W_1/W_2$ between any two adjacent spacer patterns 120 are the same. According to FIGS. 1-2B, it should be easily realize that the spacer patterns 120 are formed by spacer image transfer (SIT) approach, also known as self-aligned double patterning (hereinafter abbreviated as SADP) approach in accordance with the preferred embodiment, but not limited to this.

Figure 3A:
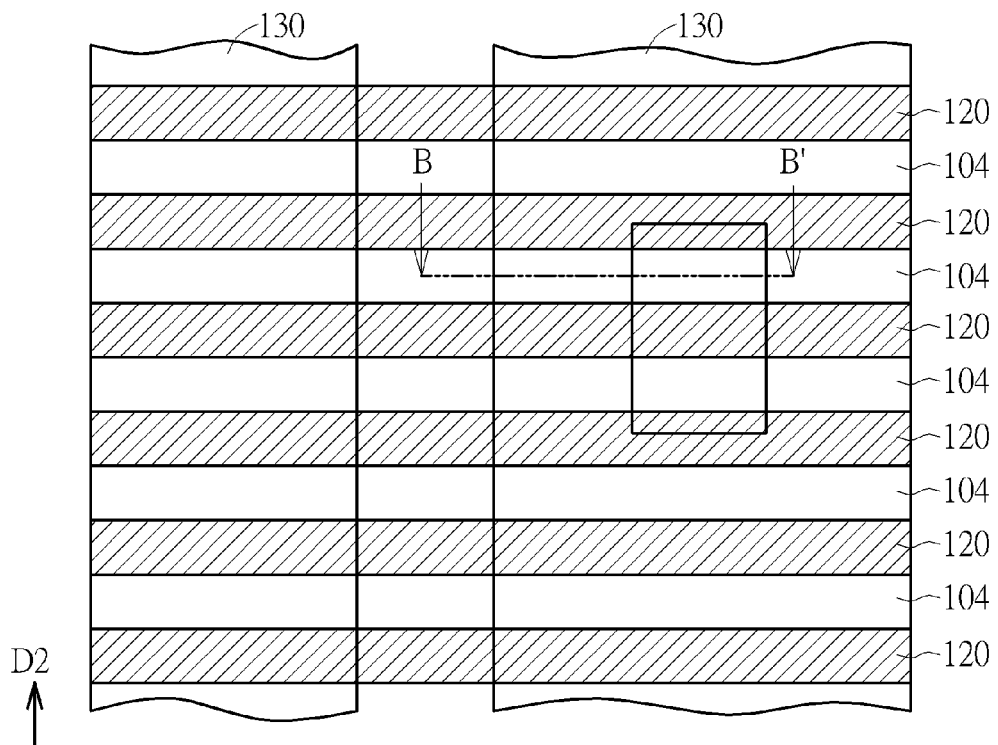
Figure 3B:
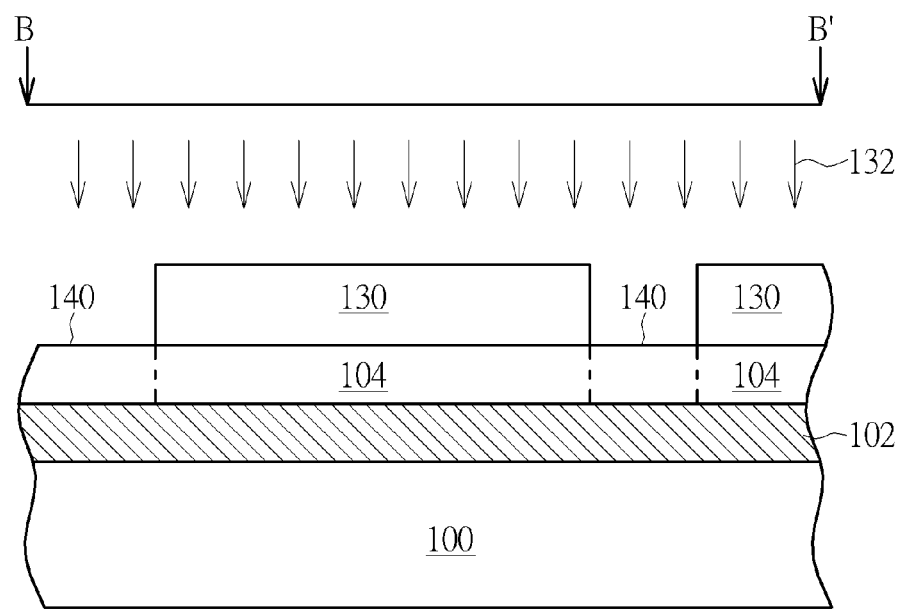
Figure 3B:
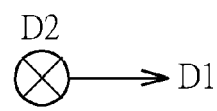

Please refer to FIGS. 3A and 3B. Next, a patterned photoresist 130 is formed on the substrate 100. The patterned photoresist 130 exposes portions of the spacer patterns 120 and portions of the sacrificial layer 104. Subsequently, a differentiating treatment is performed. In the preferred embodiment, because the sacrificial layer 104 includes the negative photoresist, the differentiating treatment includes a photolithography process 132. During the photolithography process 132, the sacrificial layer 104 exposed by the patterned photoresist 130 is hardened. Therefore, a plurality of hardened negative photoresists are formed in the sacrificial layer 104 after performing the photolithography process 132, and those hardened negative photoresists serve as blocking elements. In other words, the preferred embodiment is to form a plurality of first blocking layers 140 in the sacrificial layer 104 and the first blocking layers 140 include the hardened negative photoresists. It is noteworthy that the patterned photoresist 130 includes an opening pattern which extends along the second direction D2 as shown in FIG. 3A. Therefore, the first blocking layers 140 form a first pattern transferred from the patterned photoresist 130 and the first pattern therefore is obtained corresponding to the opening pattern. As shown in FIG. 3A, the first blocking layers 140 are arranged along the second direction D2, therefore the first pattern is extended along the second direction D2 in accordance with the preferred embodiment. In other words, the first blocking layers 140 form the first pattern, and an extending direction of the first pattern is perpendicular to an extending direction of the spacer patterns 120, but not limited to this. The patterned photoresist 130 is removed after forming the first blocking layers 140.

Figure 4A:
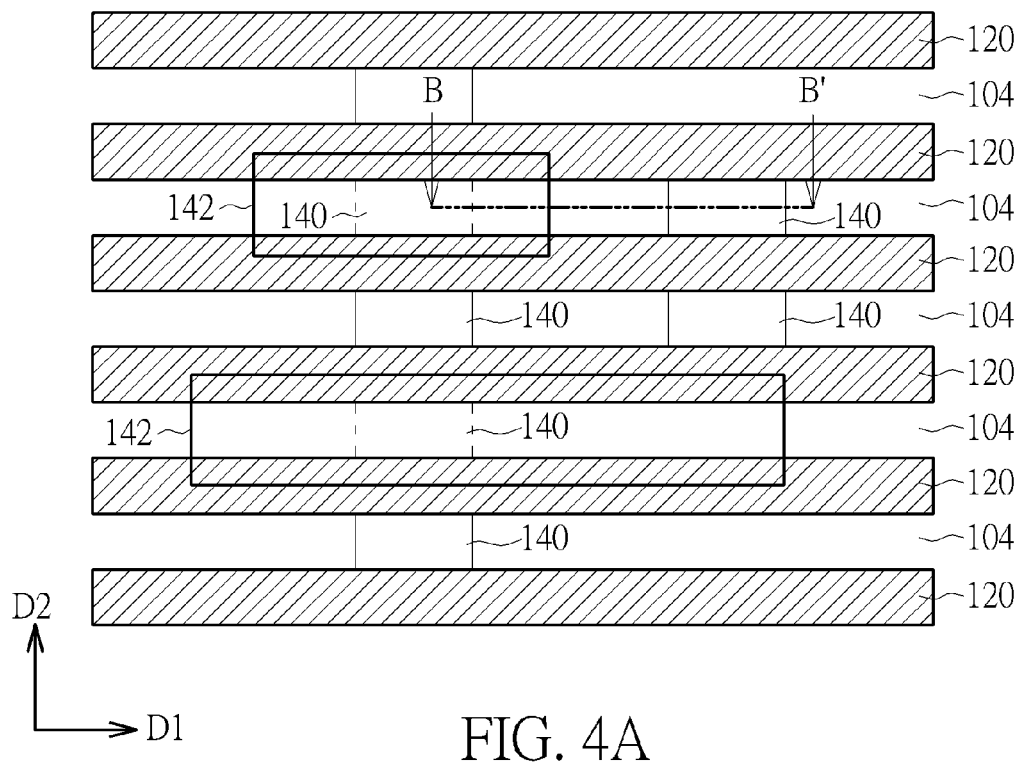
Figure 4B:
Figure 4B:
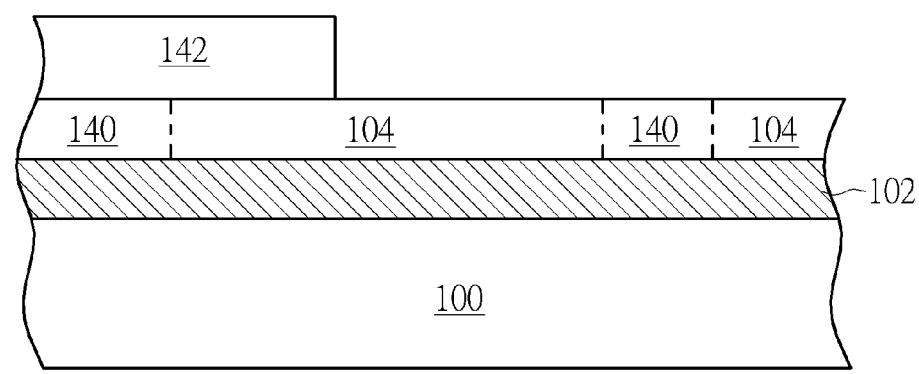

Please refer to FIGS. 4A and 4B. Next, a plurality of second blocking layers 142 are formed on the substrate 100. The second blocking layers 142 expose at least a portion of the sacrificial layer 104 and at least a portion of the first blocking layers 140. The second blocking layers 142 can include insulating material. According to the preferred embodiment, the second blocking layers 142 preferably include photoresist material. Furthermore, the second blocking layers 142 form a second pattern. As shown in FIG. 4A, the second blocking layers 142 are extended along the first direction D1 and arranged along the second direction D2. Therefore, the first pattern formed by the first blocking layers 140 is perpendicular to the second pattern formed by the second blocking layers 142 in the preferred embodiment. It is also noteworthy that the first pattern formed by the first blocking layers 140 corresponds to the opening pattern of the patterned photoresist 130 while the second pattern formed by the second blocking layers 142 is a mask pattern.

Figure 5A:
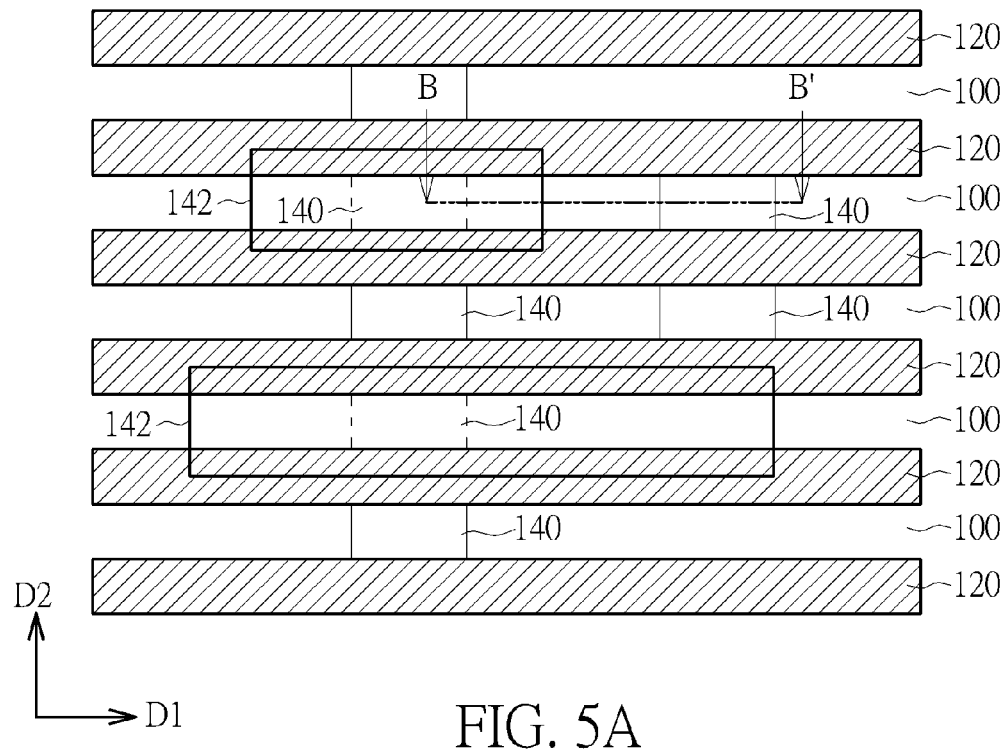
Figure 5B:
Figure 5B:
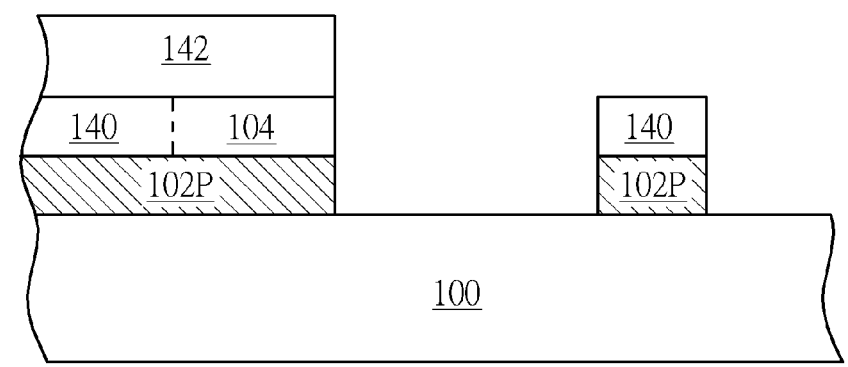

Please refer to FIGS. 5A and 5B. Next, an etching process is performed. It should be noted that the spacer patterns 120, the first blocking layers 140 and the second blocking layers 142 serve as etching masks in the etching process. Therefore element(s) exposed by the spacer patterns 120, the first blocking layers 140 and the second blocking layers 142 is removed by the etching process. According to the preferred embodiment, the sacrificial layer 104 and the hard mask layer 102 exposed by the spacer patterns 120, the first blocking layers 140 and the second blocking layers 142 are removed and a patterned hard mask layer 102P is therefore formed on the substrate 100.

Figure 6A:
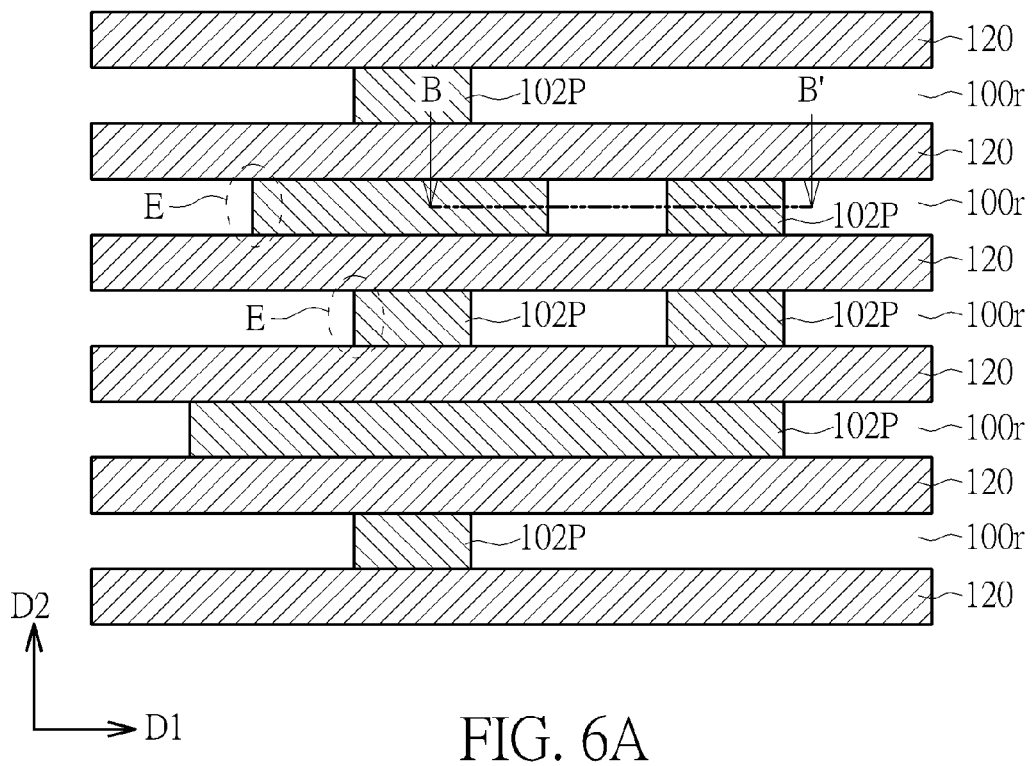
Figure 6B:
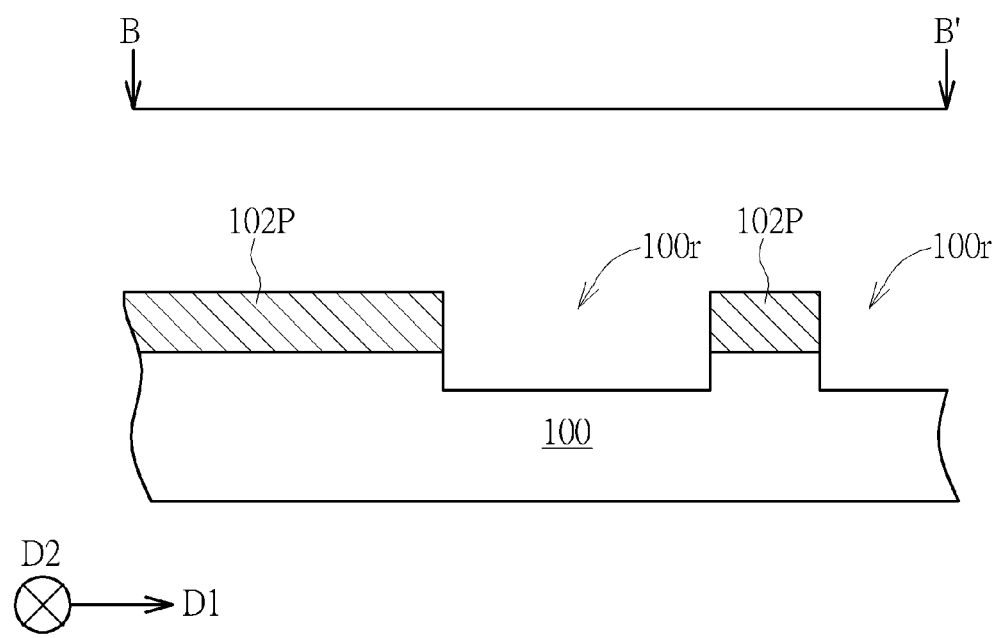

Please refer to FIGS. 6A and 6B. The first blocking layers 140 and the second blocking layers 142 are removed after forming the patterned hard mask layer 102P. Subsequently, the substrate 100 is etched with the patterned hard mask layer 102P and the spacer patterns 120 serving as an etching mask. Consequently, a plurality of recesses 100r are formed in the substrate 100. According to the preferred embodiment, an opening pattern formed by the recesses 100r is obtained. More important, the opening pattern formed by the recesses 100r is complementary to the spacer patterns 120 and the pattered hard mask layer 102P. That is, the opening pattern formed by the recesses 100r is complementary to the spacer patterns 120, the first blocking layers 140, and the second blocking layers 142.

Figure 7A:
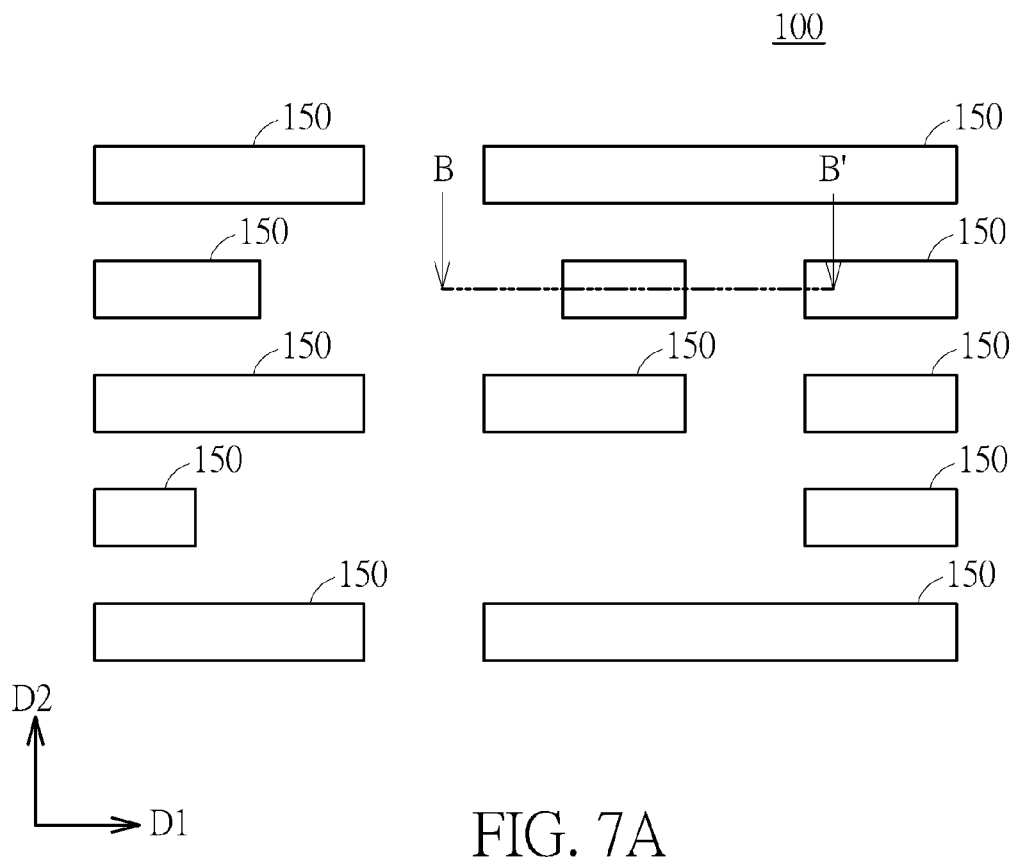
Figure 7B:
Figure 7B:
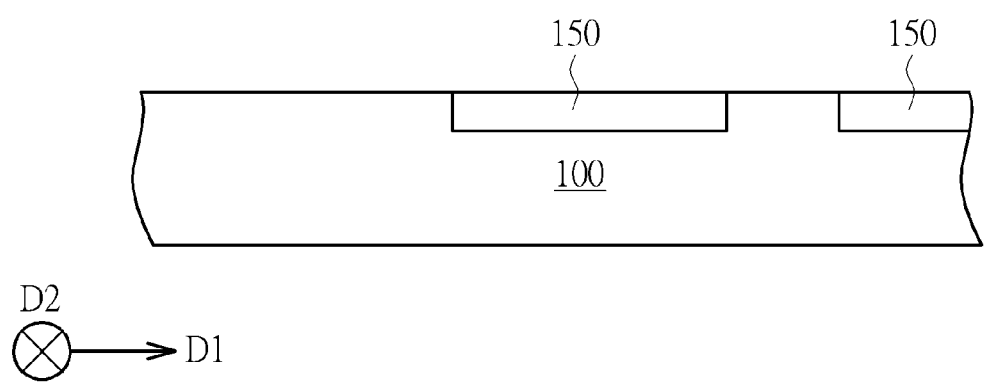

Please refer to FIGS. 7A and 7B. After forming the recesses 100r, a material layer (not shown) such as a conductive layer is formed on the substrate 100. The recesses 100r are filled up with the conductive layer which includes, for example but not limited to, a metal layer. Subsequently, a planarization process is performed to remove superfluous material layer and to remove the patterned hard mask layer 102P. Consequently, a plurality of conductive patterns 150 are formed in the substrate 100 according to the preferred embodiment. It should be easily realized by those skilled in the art that the material layer is not limited to the metal layer. In an embodiment of the invention, when FinFET fabricating process is required, the material layer can include epitaxial layer. In other embodiment of the invention, the material layer can include dielectric material if required.

Please refer to FIGS. 6A and 7A simultaneously. According to FIGS. 6A and 7A, the conductive patterns 150 are complementary to the spacer patterns 120 and the patterned hard mask layer 102P. That is, according to the method for forming patterns for semiconductor device provided by the preferred embodiment, the wanted/object patterns are decomposed into the spacer patterns 120, the first blocking layers 140, and the second blocking layers 142. The first blocking layers 140 and the second blocking layers 142 alternatively include a pattern of which the extending direction is perpendicular to the extending direction of the spacer patterns 120. Accordingly, the tiny jogs or connections, as emphasized by Circle E in FIG. 6A, can be precisely and accurately formed. Furthermore, corner rounding issue is eliminated according to the method for forming the patterns for semiconductor device provided by the preferred embodiment. Therefore, the fine patterns can be faithfully formed on the object layer/substrate by the method provided by the preferred embodiment. Furthermore, it should be easily realized that though the preferred embodiment adopts SADP technique, self-aligned quadruple patterning (SAQP) can be used if required.

Figure 8A:
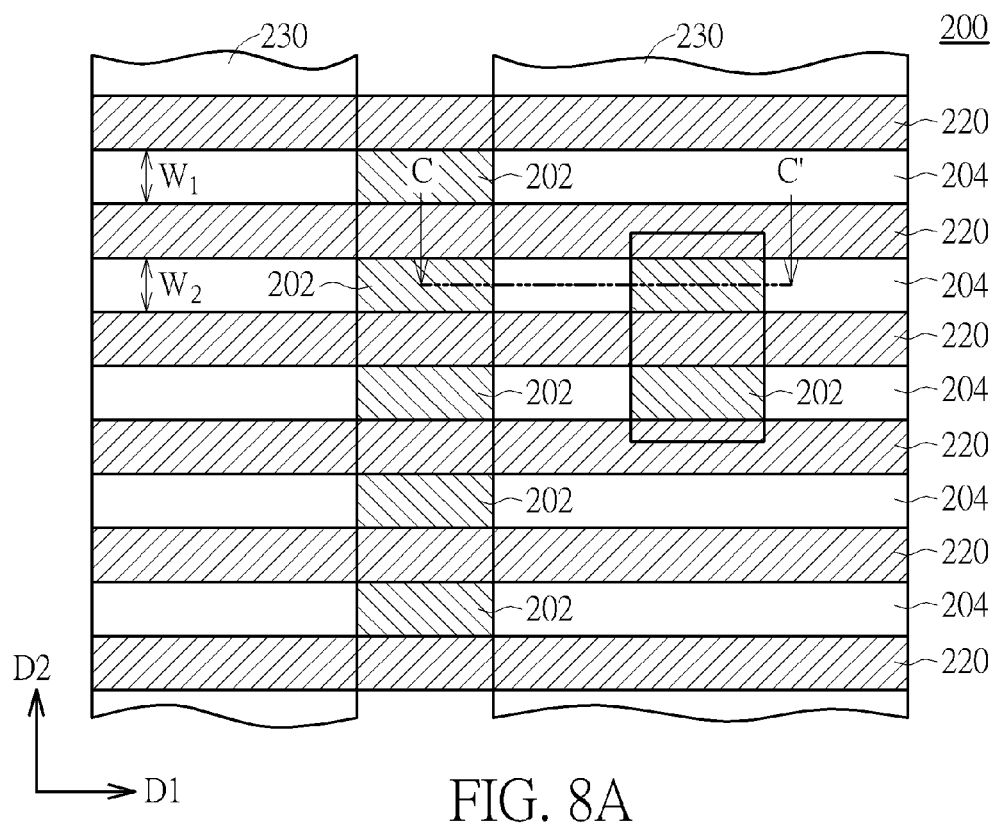

Please refer to FIGS. 8A-12B, which are schematic drawings illustrating a method for forming patterns for semiconductor device provided by a second preferred embodiment of the present invention. FIGS. 8B-12B are cross-sectional views taken along a line C-C' of FIGS. 8A-12A, respectively. As shown in FIG. 8A, the preferred embodiment first provides a substrate 200, such as a silicon substrate. The substrate 200 can include a SOI substrate or a bulk silicon substrate if required. Furthermore, the substrate 200 can even include dielectric layer if required, but not limited to this. As mentioned above, it is therefore concluded that the substrate 200 provided by the preferred embodiment can be any suitable substrate or lamination capable of accommodating semiconductor IC elements. The substrate 200 includes at least a hard mask layer 202 and a sacrificial layer 204 formed thereon. In the preferred embodiment, the hard mask layer 202 can include a metal hard mask layer. For example but not limited to, the hard mask layer 202 can include TiN. In the preferred embodiment, the sacrificial layer 204 can include insulating material such as silicon oxide (SiO), silicon nitride (SiN), silicon oxycarbide (SiOC), silicon oxynitride (SiON), or positive photoresist, but not limited to this. Next, a plurality of spacer patterns 220 are formed on the substrate 200. As shown in FIG. 8A, the spacer patterns 220 are extended along a first direction D1 and parallel with each other. Furthermore, the spacer patterns 220 are arranged along a second direction D2. In the preferred embodiment, the first direction D1 and the second direction D2 are perpendicular to each other, but not limited to this. It should be noted that steps for forming the spacer patterns 220 are the same with the steps described in the first preferred embodiment: a plurality of mandrel patterns (not shown) are formed on the substrate 200, spacers (not shown) are formed on sidewalls of the mandrel patterns, and the mandrel patterns are then removed. Thus, the spacer patterns 220 are obtained by the SADP approach. Since the steps and material choice for the mandrel/spacer patterns are the same with the first preferred embodiment, those details are omitted in the interest of brevity. Furthermore, spacing widths $W_1/W_2$ between any two adjacent spacer patterns 220 are the same in the preferred embodiment. However, the spacing widths $W_1/W_2$ between any two adjacent spacer patterns 220 can be adjusted independently.

Figure 8B:
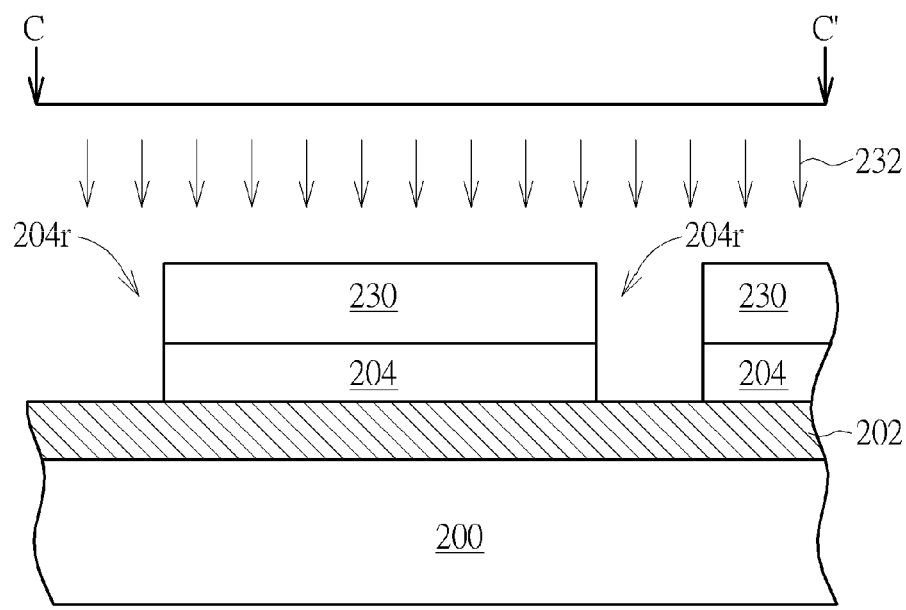

Please still refer to FIGS. 8A and 8B. Next, a patterned photoresist 230 is formed on the substrate 200. The patterned photoresist 230 exposes portions of the spacer patterns 220 and portions of the sacrificial layer 204. Subsequently, an etching process 232 is performed with the patterned photoresist 230 serving as an etching mask. Consequently, the exposed portions of the sacrificial layer 204 are removed and thus a plurality of recesses 204r are formed in the sacrificial layer 204. It is noteworthy that the hard mask layer 202 is exposed at bottoms of the recesses 204r.

Figure 9A:
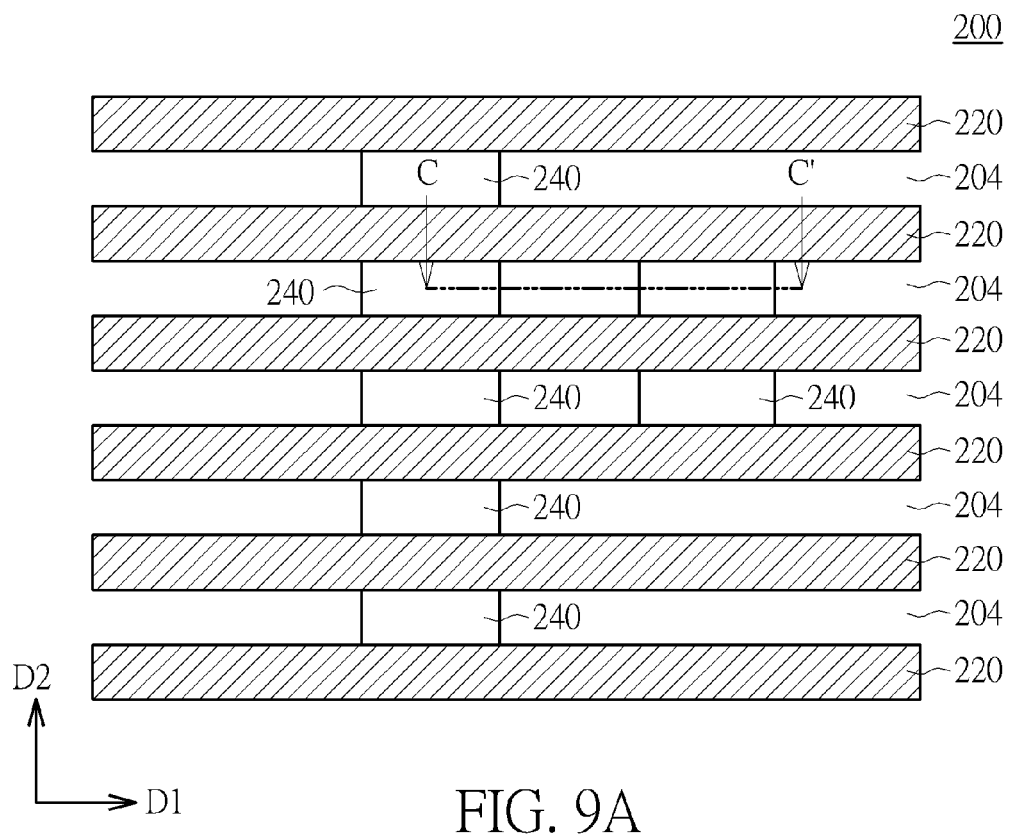
Figure 9B:

Please refer to FIGS. 9A and 9B. Next, the patterned photoresist 230 is removed and followed by performing an oxidation process. For example but not limited to, a plasma treatment employing oxygen-containing gas is performed. Consequently, the hard mask layer 202 exposed at the bottoms of the recesses 204r is oxidized and thus a titanium oxynitride ($TiO_xN_y$) is respectively formed in each recess 204r. More important, the oxides of the hard mask layer 202 serve as blocking elements in the preferred embodiment. In other words, the preferred embodiment is to form a plurality of first blocking layers 240 in the sacrificial layer 204, particularly in the recesses 204r, and the first blocking layers 240 include the oxides of the hard mask layer 202, such as $TiO_xN_y$, in the preferred embodiment. Please refer to FIGS. 8A and 9A simultaneously. It is noteworthy that the patterned photoresist 230 includes an opening pattern which extends along the second direction D2 as shown in FIG. 8A, and the first blocking layers 240 form a first pattern transferred from the patterned photoresist 230. Thus, the first pattern is formed corresponding to the opening pattern. As shown in FIGS. 8A and 9A, the first pattern formed by the first blocking layers 240 is extended along the second direction D2 in accordance with the preferred embodiment. In other words, the first blocking layers 240 form the first pattern and an extending direction of the first pattern is perpendicular to an extending direction of the spacer patterns 220, but not limited to this. The patterned photoresist 230 is removed after forming the first blocking layers 240.

Figure 10A:
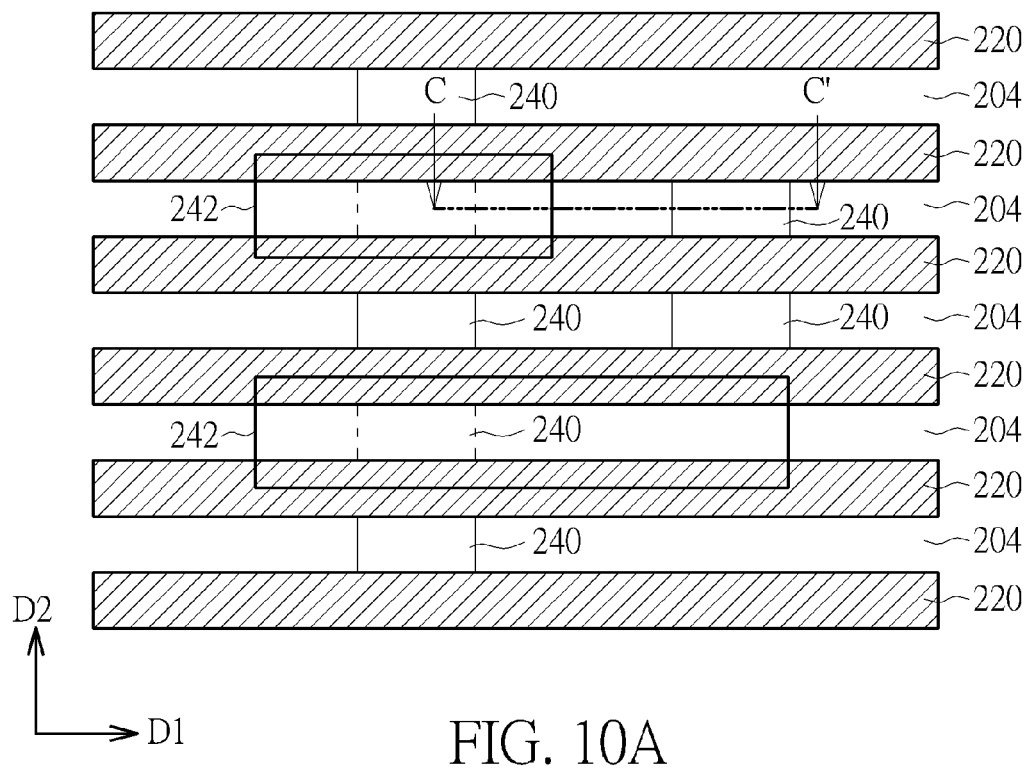
Figure 10B:
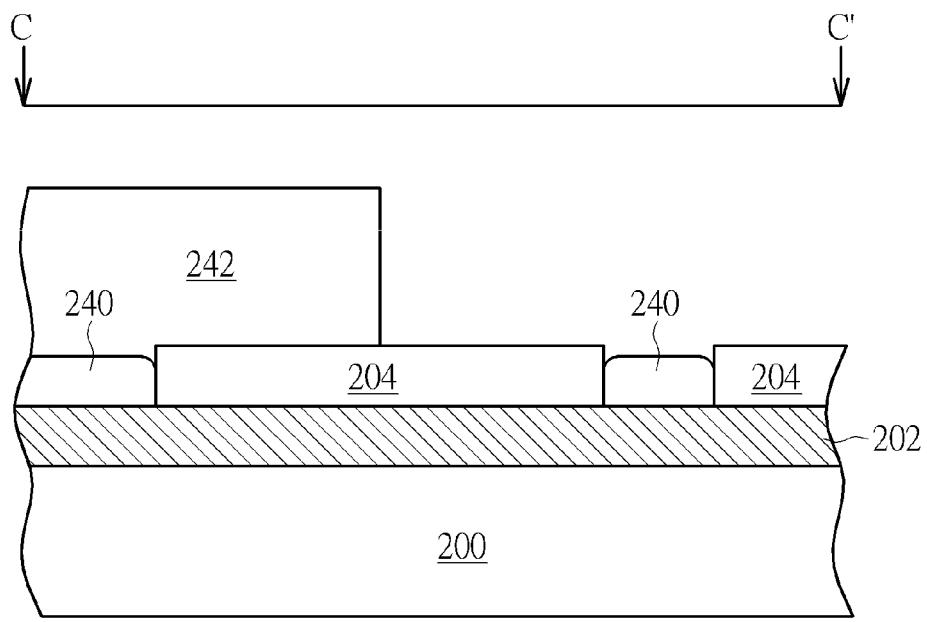

Please refer to FIGS. 10A and 10B. Next, a plurality of second blocking layers 242 are formed on the substrate 200. The second blocking layers 242 expose at least a portion of the sacrificial layer 204 and at least a portion of the first blocking layers 240. The second blocking layers 242 can include insulating material. According to the preferred embodiment, the second blocking layers 242 preferably include photoresist material. Furthermore, the second blocking layers 242 form a second pattern. As shown in FIG. 10A, the second blocking layers 242 are extended along the first direction D1 and arranged along the second direction D2. According to the preferred embodiment, the first pattern formed by the first blocking layers 240 is perpendicular to the second pattern formed by the second blocking layers 242. It is also noteworthy that the first pattern formed by the first blocking layers 240 corresponds to the opening pattern of the patterned photoresist 230 while the second pattern formed by the second blocking layers 242 is a mask pattern.

Figure 11A:
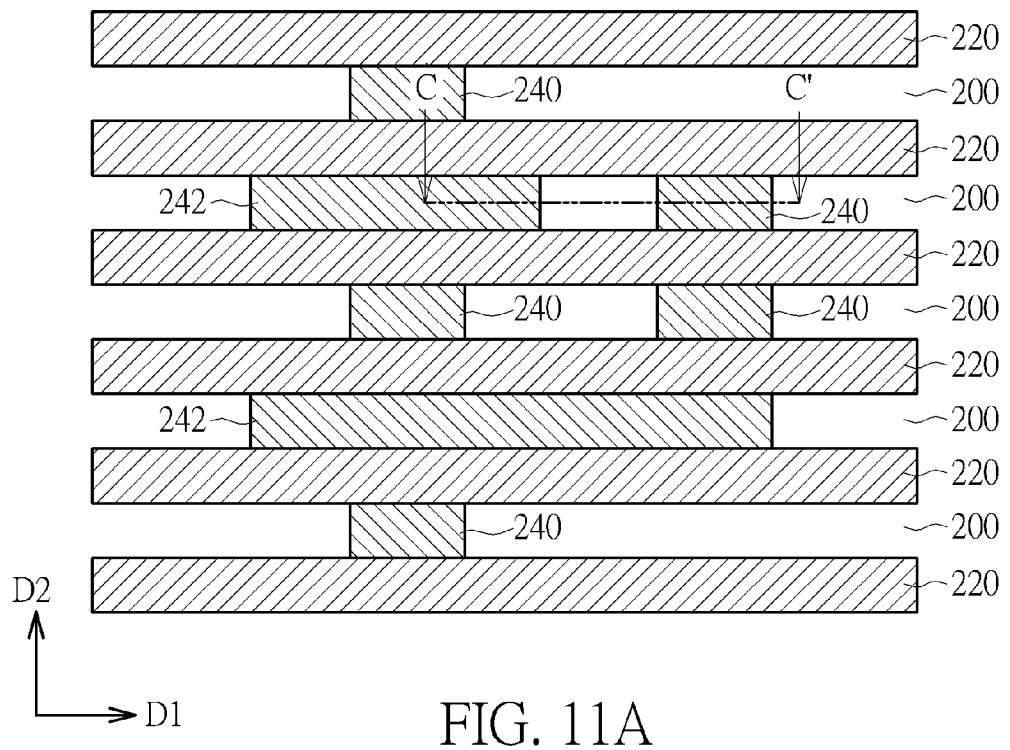
Figure 11B:
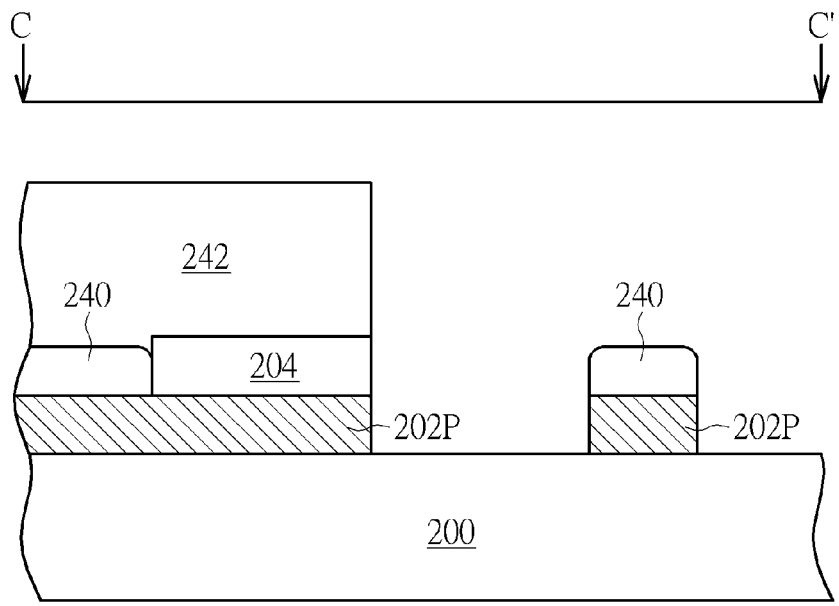

Please refer to FIGS. 11A and 11B. Next, an etching process is performed. It should be noted that the spacer patterns 220, the first blocking layers 240 and the second blocking layers 242 serve as etching masks in the etching process. Therefore element(s) exposed by the spacer patterns 220, the first blocking layers 240 and the second blocking layers 242 is removed by the etching process. That is, the sacrificial layer 204 and the hard mask layer 202 exposed by the spacer patterns 220, the first blocking layers 240 and the second blocking layers 242 are removed and a patterned hard mask layer 202P is therefore formed on the substrate 200 according to the preferred embodiment.

Figure 12A:
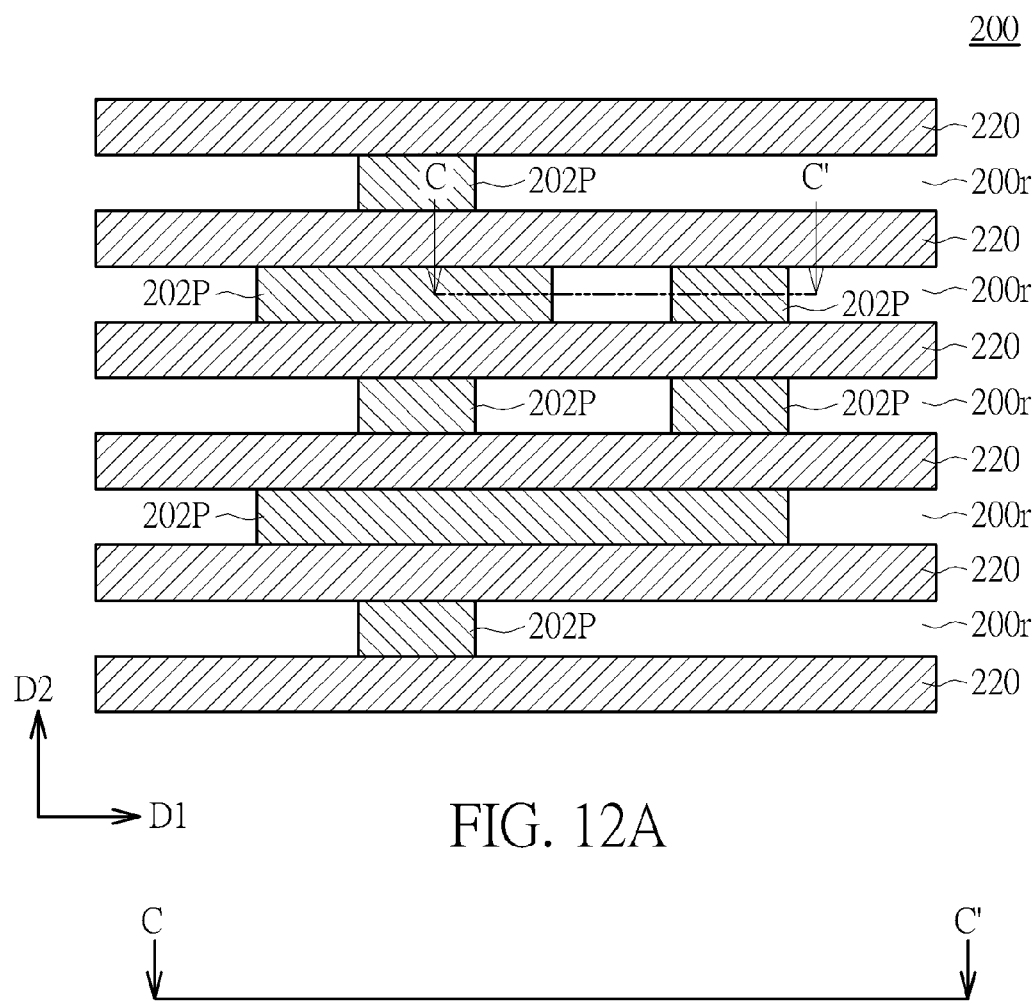
Figure 12B:
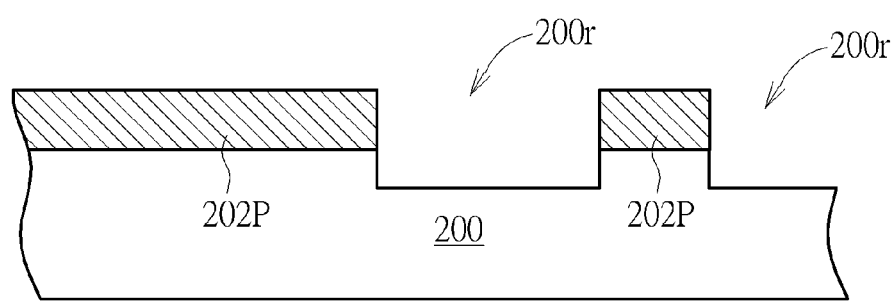

Please refer to FIGS. 12A and 12B. The first blocking layers 240 and the second blocking layers 242 are removed after forming the patterned hard mask 202P. Subsequently, the substrate 200 is etched with the patterned hard mask layer 202P and the spacer patterns 220 serving as an etching mask. Consequently, a plurality of recesses 200r are formed in the substrate 200. According to the preferred embodiment, an opening pattern formed by the recesses 200r is obtained. More important, the opening pattern formed by the recesses 200r is complementary to the spacer patterns 220, the first blocking layers 240, and the second blocking layers 242. After forming the recesses 200r, a material layer (not shown) such as a conductive layer is formed on the substrate 200. The recesses 200r are filled up with the conductive layer which includes, for example but not limited to, a metal layer. Subsequently, a planarization process is performed to remove superfluous material layer and to remove the patterned hard mask layer 202P. Consequently, a plurality of conductive patterns (not shown) are formed in the substrate 200 according to the preferred embodiment. Since the steps for forming the conductive patterns are the same with the first preferred embodiment, those details are omitted for simplicity.

According to the method for forming patterns for semiconductor device provided by the preferred embodiment, the wanted/object patterns are decomposed into the spacer patterns 220, the first blocking layers 240, and the second blocking layers 242. The first blocking layers 240 and the second blocking layers 242 alternatively include a pattern of which the extending direction is perpendicular to extending direction of the spacer patterns 220. Accordingly, the tiny jogs or connections can be precisely and accurately formed. Furthermore, corner rounding issue can be eliminated according to the method for forming the patterns for semiconductor device provided by the preferred embodiment. Therefore, the fine patterns can be faithfully formed on the object layer/substrate by the method provided by the preferred embodiment. Furthermore, it should be easily realized that though the preferred embodiment adopts SADP technique, self-aligned quadruple patterning (SAQP) can be used if required.

Briefly speaking, according to the method for forming patterns for semiconductor device provided by the present invention, the wanted patterns are decomposed into the spacer patterns, the first blocking layers, and the second blocking layers. With the spacer patterns, the first blocking layers and the second blocking layers serving as masks, the hard mask layer is patterned. Consequently, the patterned hard mask layer is obtained. More important, the patterned hard mask layer includes the wanted patterns or the patterns complementary to the wanted patterns. Therefore, the method for forming the patterns for semiconductor device provide by the present invention is able to precisely and accurately form the required fine features and thus process yield is ensured. Furthermore, though the preferred embodiments are provided to form the conductive patterns but the method provided by the present invention can be performed to form various patterns required in the semiconductor fabricating processes. For example, the method provided by the present invention can be used to form fin patterns for FinFET. In other words, the method provided by the present invention, which adopts SADP or SAQP approach, is to precisely and accurately form fine patterns in any layer in the semiconductor fabricating processes. Since the patterns are faithfully formed, semiconductor device can be successfully constructed and thus yield is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming patterns for semiconductor device comprising:
   providing a substrate, the substrate comprising a hard mask layer and a sacrificial layer formed thereon;
   forming a plurality of spacer patterns parallel with each other on the substrate, the spacer patterns being directly formed on the sacrificial layer;
   removing portions of the sacrificial layer to form a plurality of recesses in the sacrificial layer;
   forming a plurality of first blocking layers respectively in the recesses;
   forming a plurality of second blocking layers exposing at least a portion of the sacrificial layer and at least a portion of the first blocking layers on the substrate after forming the first blocking layers; and
   etching the sacrificial layer and the hard mask layer with the spacer patterns, the first blocking layers and the second blocking layers serving as etching masks to form a patterned hard mask layer on the substrate.

2. The method for forming the patterns for semiconductor device according to claim 1, further comprising:
   forming a plurality of mandrel patterns on the substrate;
   forming a spacer respectively on sidewalls of the mandrel patterns; and
   removing the mandrel patterns to form the spacer patterns on the substrate.

3. The method for forming the patterns for semiconductor device according to claim 1, wherein the hard mask layer comprises titanium nitride (TiN).

4. The method for forming the patterns for semiconductor device according to claim 3, wherein the first blocking layers comprises titanium oxynitride (TiON).

5. The method for forming the patterns for semiconductor device according to claim 1, wherein the second blocking layers comprise insulating materials.

6. The method for forming the patterns for semiconductor device according to claim 5, wherein the second blocking layers comprise photoresist materials.

7. The method for forming the patterns for semiconductor device according to claim 1, wherein the first blocking layers form a first pattern and the second blocking layers form a second pattern.

8. The method for forming the patterns for semiconductor device according to claim 7, wherein the first pattern is perpendicular to the second pattern.

9. The method for forming the patterns for semiconductor device according to claim 1, further comprising removing the first blocking layers and the second blocking layers after forming the patterned hard mask layer.

10. The method for forming the patterns for semiconductor device according to claim 1, further comprising etching the substrate after forming the patterned hard mask layer.

11. The method for forming the patterns for semiconductor device according to claim 10, further comprising forming a plurality of conductive patterns in the substrate after etching the substrate.

12. The method for forming the patterns for semiconductor device according to claim 1, wherein the sacrificial layer comprises insulating materials.

13. The method for forming the patterns for semiconductor device according to claim 12, wherein the sacrificial layer comprises silicon oxide (SiO), silicon nitride (SiN), silicon oxycarbide (SiOC), silicon oxynitride (SiON), or positive photoresist material.

\* \* \* \* \*